United States Patent
Wagner et al.

(10) Patent No.: US 8,657,475 B2
(45) Date of Patent: Feb. 25, 2014

(54) LIGHT SOURCE

(75) Inventors: Nicole J. Wagner, Monrovia, CA (US);
Craig R. Schardt, Woodbury, MN (US);
Zhaohui Yang, North Oaks, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 146 days.

(21) Appl. No.: 13/499,884

(22) PCT Filed: Oct. 12, 2010

(86) PCT No.: PCT/US2010/052224
§ 371 (c)(1),
(2), (4) Date: Apr. 2, 2012

(87) PCT Pub. No.: WO2011/046887
PCT Pub. Date: Apr. 21, 2011

(65) Prior Publication Data
US 2012/0193607 A1    Aug. 2, 2012

Related U.S. Application Data

(60) Provisional application No. 61/251,486, filed on Oct. 14, 2009.

(51) Int. Cl.
*B60Q 1/06*     (2006.01)
(52) U.S. Cl.
USPC .............................. 362/373; 362/237; 362/244
(58) Field of Classification Search
USPC ........................................ 362/235, 244, 237
See application file for complete search history.

(56) References Cited

U.S. PATENT DOCUMENTS

| | | | |
|---|---|---|---|
| 3,518,476 A | 6/1970 | Winstel | |
| 3,852,798 A | 12/1974 | Leabailly | |
| 6,599,002 B2 * | 7/2003 | Hsieh et al. | 362/555 |
| 6,860,607 B2 * | 3/2005 | Yanagisawa | 353/38 |

(Continued)

FOREIGN PATENT DOCUMENTS

WO     WO 2008/109296     9/2008

OTHER PUBLICATIONS

International Application No. PCT/US2010/052224 Written Opinion dated Dec. 10, 2010.

(Continued)

*Primary Examiner* — Evan Dzierzynski
(74) *Attorney, Agent, or Firm* — Daniel J. Iden

(57) ABSTRACT

Wherein the light source comprising: a monolithic emissive semiconductor device; and an array of lenslets, the lenslets being optically and mechanically coupled to the monolithic emissive semiconductor device; wherein the monolithic emissive semiconductor device comprises an array of localized light emission regions, each region corresponding to a given lenslet; wherein the lenslets have an apparent center of curvature ($C_a$), an apparent focal point ($f_a$), a radius of curvature (R) and a lenslet base diameter (D), the base diameter being the width of the lenslet at the intersection with the monolithic emissive semiconductor device; wherein the distance along the lenslet optic axis between the $C_a$ and the $f_a$ are normalized, such that $C_a$ is located at distance 0 and $f_a$ is located at point 1; wherein each localized light emission region is located at a point that is greater than 0, and less than Formula (I); and wherein each light emission region has a diameter, the emission region diameter measuring one-third or less of a corresponding lenslet base diameter.

23 Claims, 8 Drawing Sheets

(56) References Cited

U.S. PATENT DOCUMENTS

| | | |
|---|---|---|
| 2004/0026706 A1 | 2/2004 | Bogner |
| 2006/0028535 A1 | 2/2006 | Sakurai |
| 2006/0114365 A1 | 6/2006 | Takahashi |
| 2008/0030986 A1 | 2/2008 | Ogawa |
| 2008/0037271 A1 | 2/2008 | Grace |
| 2008/0048553 A1 | 2/2008 | Destain |
| 2008/0283855 A1 | 11/2008 | Streubel |
| 2009/0014913 A1 | 1/2009 | Lin |
| 2010/0053954 A1* | 3/2010 | Chao et al. .................... 362/235 |

OTHER PUBLICATIONS

International Application No. PCT/US2010/052224 Search Report dated Dec. 10, 2010.

U.S. Appl. No. 61/114,237, filed Nov. 13, 2008, to Wagner et al., entitled *Electrically Pixelated Luminescent Device Incorporating Optical Elements*.

U.S. Appl. No. 61/251,486, filed Oct. 14, 2009, to Wagner et al., entitled *Light Source*.

Deimel, Peter, "Calculations for integral lenses on surface-emitting diodes" Applied Optics 24 (1985) 343.

Gardner et al. "Blue-emitting InGaN—GaN double-heterostructure light-emitting diodes reaching maximum quantum efficiency about 200A/cm$^2$" Applied Physics Letter 91 (2007) 243506.

Hasegawa et al. "Coupling of spherical-surfaced LED and spherical-ended fiber" Journal of Applied Physics 51 (1980) 30.

Shealy et al. "Simulation of optical coupling from surface emitting LEDs" Applied Optics vol. 22, Issue 11 (1983) pp. 1722-1730.

Wu et al. "Azimuthally isotropic irradiance of GaN-based light-emitting diodes with GaN microlens arrays" Optics Express, vol. 17, Issue 8, pp. 6148-6155 (2009).

* cited by examiner

--- index = 1.6
— index = 2.0
— index = 2.4
--- index = 2.8
— index = 3.0
— no lenses

LIGHT SOURCE

CROSS REFERENCE TO RELATED APPLICATIONS

This application is a national stage filing under 35 U.S.C. 371 of PCT/US2010/052224, filed on Oct. 12, 2010, which claims priority to U.S. Provisional Application No.61/251, 486, filed on Oct. 14, 2009, the disclosure of which is incorporated by reference in its/their entirety herein.

FIELD

The present description relates to light sources, in particular to light sources having improved efficiency and methods for producing such light sources.

SUMMARY

In one aspect, the present application provides a light source. The light source includes both a monolithic emissive semiconductor device and an array of lenslets, where the lenslets are both mechanically and optically coupled to the monolithic device. The monolithic device includes an array of localized light emission regions, with each corresponding to a given particular lenslet. Each lenslet has an apparent center of curvature, apparent focal point, a radius of curvature (R), and a base diameter (D). The localized light emission region is located at a position along the optical axis between the apparent center of curvature ($C_a$) and the apparent focal point ($f_a$). If the distance between the two locations is normalized, from zero (at $C_a$) to one (at $f_a$), then the light emission region is located on the optic axis over this normalized portion at a point greater than zero and less than the function: $-3.6 \times (R/D)+2.75$. Each light emission region has a diameter that measures one-third or less of the corresponding lenslet's base diameter.

In another aspect, the present application provides a semiconductor light source. The light source includes a monolithic array of localized light emission regions, and an array of lenslets. Each lenslet of the array is in a one-to-one relationship with an emission region and optically coupled to it. Further, each lenslet has a radius of curvature (R), a base diameter (D), an apparent focal point ($f_a$), and an apparent center of curvature ($C_a$). The emission regions are positioned in a monolithic array such that the R/D is less than (one-quarter of the negative normalized distance on the optic axis from $C_a$ to $f_a$)+0.8. Each emission region has a diameter that measures one-third or less of the lenslet base diameter to which it is optically coupled.

In yet another aspect, the present application provides a light source. The light source includes a monolithic emissive semiconductor device and an array of lenslets. The lenslets are optically and mechanically coupled to the monolithic device, and have an index of refraction between of 1.8 and 3.5. The monolithic device has an array of localized light emission regions, with each corresponding to a given lenslet. The lenslets each have an apparent center of curvature ($C_a$), an apparent focal point ($f_a$), a radius of curvature (R), and a base diameter (D), with R/D being between 0.5 and 0.75. The emission regions are placed between $C_a$ and $f_a$ of their corresponding lenslet. Also, each emission region has a diameter, that is sized one-third or less than its corresponding lenslet's base diameter.

In a fifth aspect, the present application provides a method for determining the placement of a localized light emission region from an optically coupled lenslet in order to optimize collimation and efficiency of light emitted. The method includes placing the emission region between the apparent focal point ($f_a$) of the lenslet and the apparent center of curvature ($C_a$) of the lenslet. The specific distance of placement toward $f_a$ from $C_a$ is a percentage of the total distance, the percentage being greater than zero and less than $(-3.6 \times (R/D)+2.75)$, where D is at least 3 times an optically coupled light emission region diameter.

In a sixth aspect, the present application is a method for determining the placement of a localized light emission region from an optically coupled lenslet in order to optimize collimation and efficiency of light emitted. The method involves placing the emission region between the apparent focal point of the lenslet and the apparent center of curvature of the lenslet. The percentage of distance placed toward the apparent focal point from the apparent center of curvature is determined by the refractive index differential between the emission region and the lenslet material.

In another aspect the present application relates to a method for creating a light source. The method includes, first, providing a monolithic emissive semiconductor device with an array of localized light emission regions. The second step is forming an array of lenslets onto the light output surface of the monolithic device, with each lenslet corresponding to a given emission region. The lenslets are formed such that the radius of curvature divided by the lenslet base diameter is less than 0.75 and such that the apparent focal length of the lenslet and the apparent center of curvature of the lenslet surround the emission regions. The emission regions are positioned between the apparent center of curvature and the apparent focal point. Further each light emission region has a diameter that measures one-third or less than a corresponding lenslet base diameter.

In a final aspect, the present application provides a light source. The light source includes a monolithic emissive semiconductor device having a first refractive index and an array of lenslets having a second refractive index. The lenslets are optically and mechanically coupled to the monolithic device. The ratio of the second refractive index over the first refractive index is between 0.6 and 1.5. The monolithic device has an array of localized light emission regions, with each corresponding to a given lenslet. The lenslets each have an apparent center of curvature ($C_a$), an apparent focal point ($f_a$), a radius of curvature (R), and a base diameter (D), with R/D being between 0.5 and 0.75. Also, the emission regions are placed between $C_a$ and $f_a$ of their corresponding lenslet. Finally, each light emission region has a diameter that measuring one-third or less of its corresponding lenslet's base diameter.

BRIEF DESCRIPTION OF THE DRAWINGS

Throughout the specification, reference is made to the appended drawings, where like reference numerals designate like elements, and wherein.

DETAILED DESCRIPTION

Figure 1:
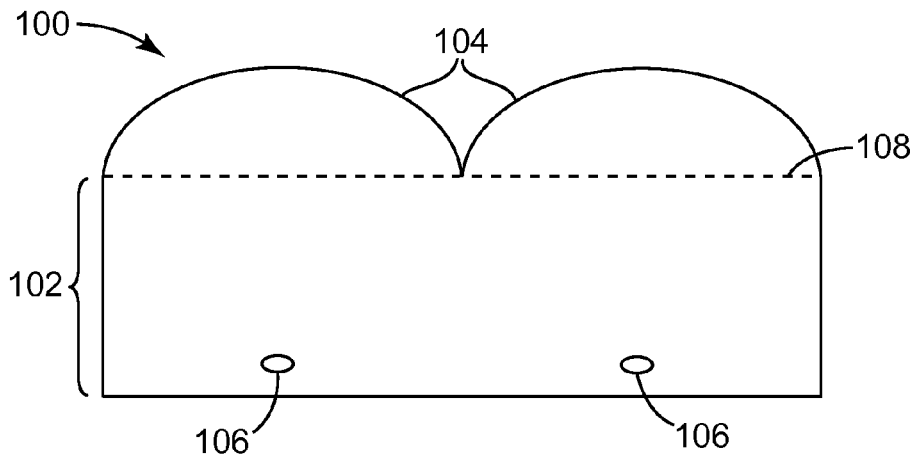
FIG. 1 is a cross-section view of a light source with an array of localized emission regions and lenslet array.

Pixelated luminescent devices (PLDs), in particular pixelated electroluminescent devices, may be useful in a number of applications, such as in displays, as a light source, for projector illumination, in sensors (e.g., biological sensors), and for digital signage. Display applications include, for instance, backlighting for a light valve imager (e.g., transmissive LCD imagers), as well as serving as an imager for direct projection (e.g., pico-projector, portable projectors, rear projection television, and icon/pointer projection). For projector illumination applications, pixelated luminescent devices such as those described herein may provide short mixing distances. Light source applications include, for instance, solid state lighting (e.g., architectural lighting). Rear projection television could also utilize single or multiple panels (e.g. x-cube) for illumination.

An increasing number of lighting applications require that a light source produce a narrow light collection angle. These applications include, for example, projection systems, street lights and automotive head lights. Unfortunately, typical light emitting materials used in these applications generally have a very broad Lambertian emission pattern. In order to efficiently collect the light in a narrow collection angle from such a Lambertian light source, a very fast optic is required (i.e. an optic with a collection half angle of 60° or more would be required to collect at least 75% of the light). The fast optics required are generally large external optics, such as large collection lenses, compound parabolic concentrators, or tapered rods. The use of such optics makes the illumination system bulky and not conducive to miniaturization, such as in an illuminator for a pico-projector.

However, an increasing number of applications that benefit from narrow light collection angles also require that the light sources and optics used therewith be capable of miniaturization, such that they may be used in more compact areas.

In addition, when light emitting diodes are used in an emissive imager (i.e., as an image source for direct projection), the emitted light from one pixel needs to be directed towards the viewer and not interfere with the light from neighboring pixels. In other words, the source must minimize cross talk. Light emitted at the pixel surface should be collimated to minimize crosstalk. Lenslets incorporated directly on the illumination source can improve the efficiency of the light being coupled into an external lens train, for example, a projection system, and provide minimum crosstalk between pixels.

It would therefore be desirable to have a light source that is compact, efficient, and manufacturable, that can be projected to produce a large, high-quality image with reduced pixel crosstalk.

The present application is directed to a light source, where lenslets at the surface of an LED are properly matched with localized emission regions within the LED to improve extraction and collimation of the light into the acceptance angle of external optics. The solution has practical value for projection engines, directed lighting applications and etendue-limited illumination engines. In addition, the present application is directed towards an LED with lenslets coupled to the device. This structure is significantly smaller than a similar LED with external collimation optics and is more suitable to embed into compact optical systems. Further, the concepts of the present application can be applied to an emissive pixelated imager used as an alternative to liquid crystal on silicon (LCOS) or micromirror array (e.g. DLP®) reflective microdisplay imagers. Similarly, the term "pixelated luminescent device" (PLD) may be a "light source" for the current disclosure.

An emissive imager is made up of an array of individual pixels. For a color imager, each of these pixels could be composed of multiple subpixels, with one subpixel for each of the primary colors used by the display to create the perceived color image. Most commonly the primary colors used are red, green, and blue and every pixel would have independently addressable red, green, and blue subpixels to allow for the creation of a wide range of perceived colors. In this application, the term pixel is used to refer to the smallest addressable element of the display. In the case of a monochrome display, a pixel would likely correspond to a single pixel of the image being displayed. In the case of a color display, a pixel would correspond to one of the primary subpixel elements used to display a pixel of the image being displayed.

The present application presents a solution for the need of a compact efficient and manufacturable light source that can be projected to produce a large, high-quality image with reduced pixel cross-talk. Each lenslet in the array of lenslets can be understood as corresponding to a pixel in a display. Optical cross-talk is defined as light flux from a source that is detected above a neighboring pixel instead of being detected above the originating source pixel. In other words it is the spreading of light from one pixel into a neighboring pixel, which can reduce color quality and sharpness of an image. In a color display, the cross-talk can reduce the color gamut by causing emission from neighboring pixels (subpixels) that are used to display primary colors different from addressed pixel. An imager may be considered efficient when at least 60% of the light from the emission region is contained within a 30° half angle. The half angle is defined as half of the cone angle. It is shown as 224 in FIG. 2.

In some embodiments, the device described herein may address the issues described above and may provide several benefits. The first benefit may be to increase device efficiency by increasing light output into a narrow cone angle. The second benefit may be to increase axial brightness by collimating the emitted light. The third benefit may be to improve image quality by reducing crosstalk. Finally, the fourth benefit may be to reduce the size of secondary optics needed to efficiently project the light from the device, thereby reducing the structure's overall size. Moreover, with increased light output efficiency and collimation, less electrical power may be required to obtain the desired light output.

A more specific understanding of the embodiments presented herein may be gained by reference to FIG. 1. FIG. 1 provides an elementary overview of the structure of one embodiment of the light source 100 presented. The light source is made up of two primary elements, the first is the monolithic emissive semiconductor device 102, and the second is the array of lenslets 104.

The monolithic emissive semiconductor device can be a light emitting diode (LED), a superluminescent diode, or a photoluminescent quantum well material array, such as a group II-VI semiconductor. A more complete description of LEDs may be found, for example, in E. F. Schubert, *Light Emitting Diodes*, 2006; and S. M. Sze, *Physics of Semiconductor Devices*, 1981.

Figure 2:
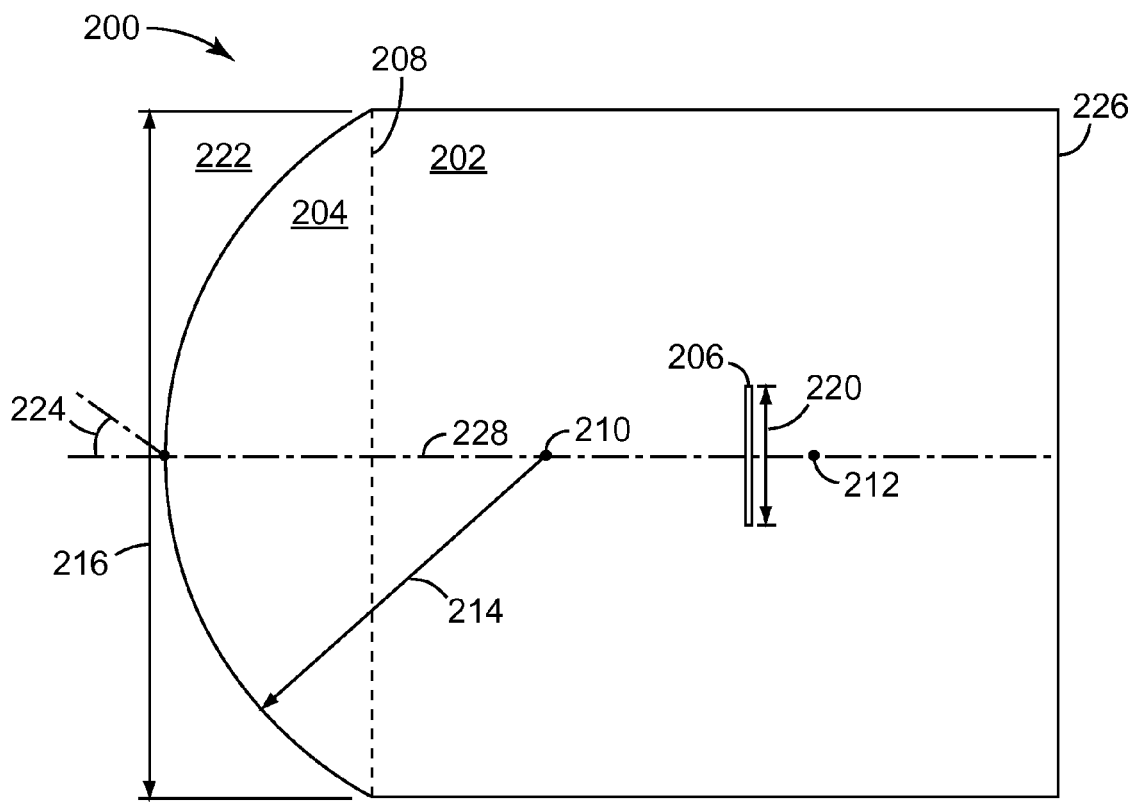
FIG. 2 is a cross-section view of a single lenslet portion of a light source with a lenslet array, as well as a corresponding single emission region of a light source with an array of localized emission regions.

The array of lenslets 104 is optically, and in this case, mechanically coupled to the monolithic emissive semiconductor device 102. The mechanical and optical coupling occurs at the lenslet base, 108. The mechanical coupling may be achieved by etching the lenslet into the same material as the monolithic emissive semiconductor device 102, or through adhering the lenslet 104 to the device 102 at the lenslet base 108. These methods are discussed in greater detail below. Also, the monolithic emissive semiconductor device, 102, includes an array of localized light emission regions 106. Localized light emission regions 106, may be referred to, for the sake of simplicity, as simply "emission regions". Light is emitted from the emission regions, 106, generally in all directions, with some portion of the emitted light directed toward the lenslets, 104, for transmission. The elements of the light source may be better understood by examining a more close-up view of a single lenslet optically coupled to a single emission region. Such a display is shown in FIG. 2. It should be understood that while the figure illustrates only one portion of an array, it is representative of all elements in an array, and therefore elements may be referred to in a plural sense.

With reference to the light source 200 in FIG. 2, the lenslet array is made up of individual lenslets, 204. The lenslets are optically coupled to the monolithic emissive semiconductor device, 202. The lenslet 204 has an index of refraction, n2. The monolithic emissive semiconductor device has an index of refraction n3. Both of these indices of refraction may be contrasted against the index of refraction of the material outside of the lenslet emission face, 222, a material that may be, for example air. This outside index of refraction is n1. Embedded within monolithic emissive semiconductor device 202 are the localized light emission regions 206.

In some embodiments, the lenslet array may be monolithically integrated with the emission region array, e.g. formed directly from the same emitting material as the emission region array, such that n2 is equal to n3. Alternatively, the lenslet array may be made from a secondary material with a refractive index greater than or similar to the emission region array material and optically bonded to the emission region array (i.e. n2≥n3). In other embodiments, it may be desirable for the index of refraction of the emission region array, n3 to be greater than or equal to the index of refraction of the lenslet array, n2. When n2 is not equal to n3, the rays crossing the boundary at the base of the lenslet are bent by the change in refractive index. The refraction of light at the boundary between the lenslet and the emission region creates the effect that a ray of light traversing this boundary from the emission region will appear to originate from a location different from the actual origin of the ray. For this reason, it is useful to define four key points: 1) the "geometric center of curvature"; 2) the "apparent center of curvature"; 3) the "geometric focal point"; and 4) the "apparent focal point" of the lens. For the center of curvature points, it should be noted that the point provided may be defined as the corresponding point for the closest fit sphere approximation of the surface of the lenslet, whether the lenslet is spherical or aspherical in shape. The focal points may be defined by the shape of the lenslet as calculated by ray tracing. The "geometric center of curvature" 210 is the point where light rays normal to a spherical lens surface would intersect, while the "apparent center of curvature" 830 (of FIG. 7) is the point where light rays normal to a spherical lens surface would intersect after accounting for the refraction at the lenslet—emission region boundary. When the lenslet and the emission region have the same refractive index (n2=n3), the geometric center of curvature 210 and apparent center of curvature 830 are coincident. When the lenslet and the emission region have different refractive indices (n2≠n3), the geometric center of curvature 210 and apparent center of curvature 830 are located in different positions. Similarly, the "geometric focal point" 212 is the point where collimated light rays close to the optical axis (paraxial approximation) and normal to the plane of the lenslets would intersect after traversing the lens surface, while the "apparent focal point" 832 (of FIG. 7) is the point where light rays close to the optical axis and normal to the plane of the lenslets would intersect after accounting for the refraction at the lens surface and the lenslet—emission region boundary. When the lenslet and the emission region have the same refractive index (n2=n3), the geometric focal point 212 and the apparent focal point 832 are coincident. When the lenslet and the emission region have different refractive indices (n2≠n3), the geometric focal point 212 and apparent focal point 832 are located in different positions. In some embodiments the location of the emissive region is between (along the line segment joining) the apparent center of curvature 830 and the apparent focal point 832.

It may also be desirable to understand the relationship of the index of refraction of the lenslets n2, and the monolithic emissive semiconductor device n3, in terms of the ratio of the two indices. For example, if one defines the index of refraction of the monolithic semiconductor device as a first index of refraction, and the index of refraction of the lenslets as the second index of refraction, there may be a desired value of the ratio of second index of refraction over first index of refraction. This optimal value generally lies in a ratio range of between 0.6 and 1.5, when the outside index of refraction, n1, is approximately 1, which would be the case when, for example, the material outside the lenslet array is air.

For an LED, the lenslets 204 can be formed in the n- or p-type material of the semiconductor 202, in a growth substrate, e.g. sapphire, silicon carbide, silicon, or indium phosphide, or in a secondary material that is coupled to the light emitting material, such as diamond, high-index glass, silica, or any other suitable material including those already listed. A growth substrate may be understood as a substrate on which the semiconductor n- and/or p-type materials are "grown," (and lenslets could be formed into the growth substrates if they were not previously detached from the semiconductor materials). The lenslets could also be made from a layered or graded material that has a range of or different refractive indices (i.e. where n2 is not constant across the lenslet). Other lenslet materials include ones that can provide a function to the device, such as being electrically conductive. Examples of electrically conductive materials may be indium-tin-oxide (ITO) or other transparent conductors such as a cured conductive paste, to operate as an electrode for the LED. Another potential function of the material may be behaving as a color-converting layer to generate optical wavelengths that differ from the emission region light. In other embodiments a color-converting layer may be used in conjunction with a separate lenslet layer.

At least one lenslet 204 of the array of lenslets may be a spherical section or may have a surface approximating a portion of the surface of a sphere. The lenslets can also be approximated as hemispheres, cylindrical (lenticular), or aspheres. The lenslets described herein, however, should not be understood to include Fresnel lenses. The particular shape of the lenslet may be used to direct the light as desired. For example, a cylindrical lenslet can be used to give collimated light in one direction and Lambertian light output in the other direction. An aspheric lenslet can be used to further control the angular distribution of emitted light in all directions. Spherical lenses are known to have certain aberrations that become more pronounced for light that is further from the axis of the lens. An aspheric lenslet will act very much in the same way as a spherical lens, but can be designed with less aberration. Therefore, one of skill in the art may understand the current definition of "aspherical lenslets" lenses which are aspherical by design. Lenses that are designed to be spherical, but may not be perfectly symmetrical, may still be understood, for purposes of this invention, as "spherical lenses."

In some embodiments, the radius of curvature of the lenslets 214 can be greater than or equal to one-half of the lenslet base diameter 216 (where the base width is equal to the width of the lenslet at its "base" 208, or the area where the lens and monolithic emissive semiconductor device interface). In other embodiments it can be greater than or equal to one-half of the lenslet base diameter 216 and less than or equal to four-fifths of the lenslet base diameter 216. The density and distribution of lenslets across a one- or two-dimensional lenslet array can be uniform or it can vary across the array. The base diameter 216 (or base width) may be a measurement of a lenslet that is non-circular. In such a case, the "base diameter" of the lenslet is defined as the diameter of the largest circle that can be drawn within the bounds of the lenslet in the plane of the lenslet base 208.

One method for fabrication of one or more lenslets in a light emitting material or its growth substrate is photoresist reflow. In this method, a positive photoresist is applied to a surface (for instance, by spin coating), patterned and exposed using a mask, developed, and heated. The subsequent heating allows the photoresist to flow to form rounded shapes. The patterned structures are then etched to create the optical elements (lenslets) on the surface.

Another method for pattering optical elements is gray scale lithography. In this process, a photoresist is applied to a surface by any appropriate coating technique, for instance, spin coating. A three dimensional pattern is then created in the photoresist layer either by photo-exposure through a gray-scale mask (a photolithography mask made with multiple levels of optical density) or by various maskless techniques such as laser or electron beam direct writing. The exposed photoresist is developed in a suitable developer to reveal the three-dimensional resist structure. The three dimensional structures are transferred into the underlying material by an etching process, for instance, reactive ion etching (RIE).

Other methods for fabricating one or more lenslets in a light emitting material or growth substrate include nanoimprint lithography, inkjet printing (of resist) and interference lithography. Each of these methods is also concluded or followed by a step of etching. Lenslets may also be formed in a secondary material and optically and/or mechanically coupled to the monolithic emissive semiconductor device. For example, lenslets from a secondary material can be molded and subsequently attached or bonded through an adhesive or wafer bonding technique. Potential bonding or adhering techniques include hot melt adhesive, welding, pressure, heat or any combination of such methods that may be desirable in a given application. Exemplary hot melt adhesives include semicrystalline polyolefins, thermoplastic polyesters, and acrylic resins. Exemplary bonding materials may include optically clear polymeric materials, clear waxes, liquid, water, or soluble glasses based on sodium silicate and spin-on glasses.

For the light source 200 to achieve high light output efficiency, the device is divided into an array of individually addressable localized light emission regions 206. The emission region can have a diameter 220 that is defined using the full width at half maximum (FWHM) of the localized light emission region in the plane perpendicular to the optical axis of the lenslet. Alternatively, the diameter 220 of the emission region can be the FWHM of the emission region inside the emitter, which would be the current density distribution at the p-n junction of an LED. The emission region diameter 220 (or emission region width) may be a measurement of an emission region that is non-circular. In such a case, the "diameter" of the emission region is defined as the diameter of the largest circle that can be drawn in the plane perpendicular to the optical axis of the lenslet and within the bounds of the emission region FWHM.

Each localized light emission region 206 can be located within an electroluminescent or photoluminescent material. Electroluminescent materials can include organic LED materials, group III-V semiconductors, and group III-Nitride semiconductors. Junctions designed with reduced efficiency loss at high current density (such as those described in Gardner N. F., *Appl. Phys. Lett.* 91, 243506) may be advantageous when used in the devices described herein, since the localized light emission regions will likely be operated at higher current density than a similar device without localized light emission regions. Photoluminescent materials may be monochrome or multicolor and include color-converting materials, such as group II-VI semiconductors, phosphors, or quantum dots. While these materials are specifically mentioned, it should be understood that the particular materials chosen are not limited to those specifically enumerated and instead the choice of materials should be guided by the suitability of the materials for a given application. Any suitable structure, including, for instance, a single quantum well, a multiple quantum well, a homojunction, a heterojunction, a double heterojunction, and the like, may be used to create the emission region.

Light can be localized within an electroluminescent material by physically removing emitting material, such as through etching, or by destroying emitting material around the emission region, such as through doping. Alternatively, light can be localized by electrically pixelating a device, which includes a continuous emitter region with electrodes designed to channel the current into specific areas of the active region. Greater discussion of electrically pixelated luminescent devices may be found in commonly owned U.S. Provisional Application 61/114,237. Designing the active region to include a cavity effect (e.g. by optimizing the distance from the active region to the p-contact metal, and setting an optimum thickness for the p-contact metal layer) may further increase forward directed light.

Each lenslet 204 may have one or more corresponding localized light emission regions 206. Thus, each emission region emits light into a given lenslet, and may correspond in a one-to-one relationship in certain embodiments. Essentially all of the lenslets have a base diameter 216, which is at least three times the diameter of the emission region, 220, to which they are respectively aligned and optically coupled (or in other words, the emission region diameter 220 is one-third or less than the lenslet base diameter 216). Each localized light emission region 206 may be centered on the optic axis, 228 of the respective lenslet and is positioned between the center of curvature 210 and the focal point 212 of the respective lenslet. The center of curvature may be defined as the point on the optic axis of the lenslet that is of a distance 214 of the "radius of curvature" of the lenslet. Because the center of curvature and focal point appear to be in different positions given the index of refraction differential in some situations, we may define an apparent center of curvature and apparent focal point (see FIG. 7, elements 830 and 832, respectively). There is an optimized position between these two points at which the functions of reduced cross-talk and increased collimation and efficiency are optimized. The position is determined according to a function which is discussed below. To aim the output light at an off-axis angle, a localized light emission region can be placed off-axis to the optic axis of its respective lenslet. In FIG. 2, if the emission region 206 is placed above the optic axis, the emitted light will be generally directed at a downward angle relative to the optic axis and if the emission region 206 is placed below the optic axis, the emitted light will be generally directed at an upward angle relative to the optic axis. When the emission region is off-axis, the position of the emission region for determining its position relative to the apparent center of curvature 830 and the apparent focal length 832 of the lenslet is defined as the projection of the emission region onto the optic axis.

The light source 200 may also include a reflective backplane 226, located on the opposite side from the light output plane, or lenslet array. The reflector may be 70% or more reflective. It is preferred that the distance from the reflective backplane to the emission region be less than 30% of the lenslet base diameter so that the reflected image does not lead to increased crosstalk. The backplane may also be made reflective by using a dielectric stack mirror or by depositing a thin insulator around the electrode contact and then coating a reflective metal over the insulator (of course, taking care not to short out the individually addressable electrodes).

The emission region array may include electrical contacts to supply power to pixels. The electrical contacts can be in the form of single contacts to individually address each pixel. The individually addressable electrical contacts may be described as electrodes. Pixelated surface electrodes may be made of any suitable material known in the art, including but not limited to metals, or metal alloys including: gold, silver, aluminum, nickel, titanium, chromium, platinum, palladium, rhodium, rhenium, ruthenium, tungsten, indium and mixtures and alloys of such. The electrodes may also be formed from transparent conductive oxides such as ITO. Single contacts can be attached from the emitting surface or through channels from the bottom of the device. Typically the electrodes are deposited on the surface of the monolithic emissive semiconductor device by, for example, e-beam evaporation. An annealing step after the deposition may be used to reduce the contact resistance between the electrodes and the semiconductor surface.

The electrical contacts may also be in the form of a grid, behaving as a common electrode. The surface opposite the pixelated surface may comprise an electrode that may contain any suitable metal such as gold, silver, aluminum, indium, alloys of any of the foregoing, and/or a transparent metal alloy, or transparent conductive oxide, e.g., Indium Tin Oxide (ITO) covering the surface of the light source. An electrical contact grid can be positioned between lenslets (i.e. at the inter-pixel regions). Therefore, the pixelated light emission region may be understood to be formed by localized current injection by electrode design.

The electrodes will typically be driven with an external controller. When pixelated surface electrodes are addressed by a circuit board, one option may be a CMOS substrate. A CMOS substrate is a substrate comprised of an integrated circuit, and thus may provide dual function of providing a mounting surface for the PLD as well as an electrical driver. The function of the electrodes is to provide current through the active localized light emission region in a location-adjustable way. Each individually addressable electrode can be seen as having a corresponding switching circuit, through which current flows upon activation. Therefore, the shape and placement of the emission surface and non-emission surface electrodes, as well as the voltage applied to the electrodes are especially important, as these characteristics help to determine the spatial output profile of emitted light.

Alternatively, the pixelated light emission regions may be understood to be formed by spatially selective ion implantation.

The light source may include secondary optics, such as projection lenses, to produce a larger image. The array of lenslets may be positioned near the input aperture of the projection optics. The projection optics may have an f/# greater than 0.5 (or numerical aperture less than 0.707). The input diameter of the projection optics (i.e., the diameter of the clear aperture of the lens element closest to the emission regions) may be less than two times the diagonal dimension of the pixel array of the monolithic emissive semiconductor device. The required collection angle, or cone angle, of the monolithic emissive semiconductor device imager is governed by the secondary optics used in an application, which could include a projection lens system for a direct projection application, or additional optics such as a beam-splitter cube, color-combiner cube, liquid crystal on silicon (LCOS) panel or digital micromirror device (such as DLP®, from Texas Instruments Co.) when the monolithic emissive semiconductor device is used as a light source.

Application-specific parameters that may be varied include refractive indices of emitting (n3), lenslet (n2), and immersion (n1) materials, the lenslet's geometric radius of curvature, geometric focal point (given n2, n3 and radius of curvature, the focal point can be calculated), and height, ratio between emission region diameter 220 and lenslet diameter 216, collection cone angle (or half angle 224), distance between lenslet 204 and emission region 206, and distance between back-reflector 226 and emission region 206. By modeling extensively with many variations in these parameters, a relationship was discovered that shows an optimal placement of the emission region 206 from the vertex of lenslet 204 along the optical axis. This optimized position is located along the optic axis at a point between the apparent center of curvature and apparent focal point, and may be determined according to the radius of curvature 224 of the lenslet and the lenslet base diameter 216. It was determined according to the following examples.

EXAMPLES

Optical Modeling of High-Index Material Coupled to a Lenslet

Modeling Method

An optical model of a high-index material coupled to a lenslet was constructed in LightTools, an Optical Research Associates ray-trace simulation software, version 6.0. A single lenslet on a light emitting material (such as that shown in FIG. 2) was modeled. The emitting material was 10×10 μm with variable localized light emission region-to-lenslet base distance. The distance from the emission region to the bottom of the emitting material was fixed at 0.1 μm. The localized light emission region was a cuboid that had a fixed thickness of 0.1 μm and varied from 1×1 μm to 10×10 μm and was positioned at the principal axis (or optic axis) of the lenslet. The radiometric power of the emission region was 1.0 Watt measured over the whole sphere. The surfaces of the emission region were optically smooth with only the top and bottom surfaces emitting rays in a uniform angular and spatial distribution, traced in an outward direction. Lenslet diameter was fixed at 10 μm, while lenslet radius of curvature was varied between 5 and 7.25 μm and lenslet height was varied between 2 and 5 μm. Emitter refractive index, n3, was fixed at 2.39 with optical density of 0.155, while lenslet refractive index, n2, was varied from 1.6 to 3.5 with optical density of 0.155. The refractive index of the ambient was that of air (n1=1). The collection cone angle was variable from 10 to 80°. The bottom of the emitter was fixed as a reflector with 80% reflectivity. The side walls were either perfect absorbers (R=0%) or reflectors (R=100%).

To create the lenslet shape, two components were constructed. The first was the emitter alone, and the second included the emitter with texture. The first was imbedded into the second component. The surface at the base of the lenslet was optically smooth with Fresnel loss and probabilistic ray split as the preferred direction. The texture of the second component was optically smooth with Fresnel loss and probabilistic ray split as the preferred direction. The optical properties of the sides of the two components were set to the same values for each simulation.

Two receivers were included in the model: far-field and near-field. The infinite far-field receiver surrounded the entire slab, collecting longitude data from 0 to 360 degrees and latitude data from 0 to 180 degrees. The near-field receiver was placed at the zenith of the lenslet texture at the top surface of the optical elements and collected incident rays. The spatial luminance angle was varied or fixed to simulate the collection angle.

Non-sequential ray traces were used to understand the path of the emitted light. A ray was removed from the simulation only after it struck a surface one thousand times. Ten thousand rays were used in each simulation. The emission region-to-lenslet base thickness, light emitting area, collection cone angle, and lenslet parameters were varied in the models.

Simulation Method

Figure 3:
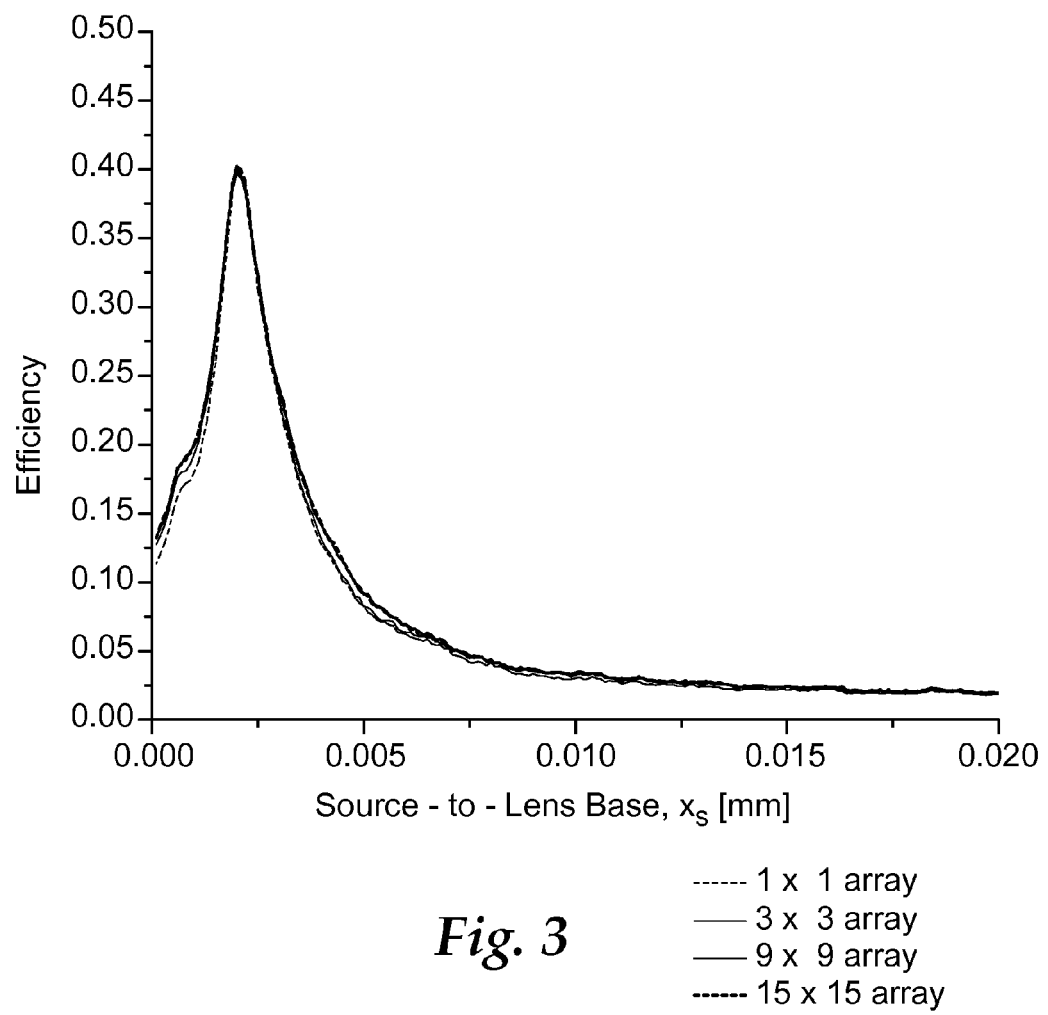
FIG. 3 is a model validation of use of a single lenslet to simulate an array of lenslets of a light source with multiple emission regions.

The light emitting material with a single lenslet was modeled to simulate an array of lenslets on a light emitting material with multiple localized light emission regions of arbitrary size. The plots in FIG. 3 show the efficiency of light emission for a single lenslet with a single localized light emission region, a 3×3 array of lenslets on a 3×3 array of localized light emission regions, a 9×9 array of lenslets on a 9×9 array of localized light emission regions, and a 15×15 array of lenslets on a 15×15 array of localized light emission regions. Sidewall conditions were 100% reflective in all cases. The plots verified the validity of using a single lenslet with a single emission region to simulate an array of lenslets with emission regions. The plots for each array size overlapped for the majority of the range of light emitting material thickness values with similar peaks in efficiency values. Small differences were due to scattering off neighboring lenslets once the light has escaped into the ambient.

Influence of Collection Cone Angle and Light Emission Region-to-Lenslet Base Distance Applications that demand high light output within a narrow collection cone angle, such as a projection system, require that the light emitting component emit a high amount of its light into the collection cone angle of the projection lens.

Figure 4:
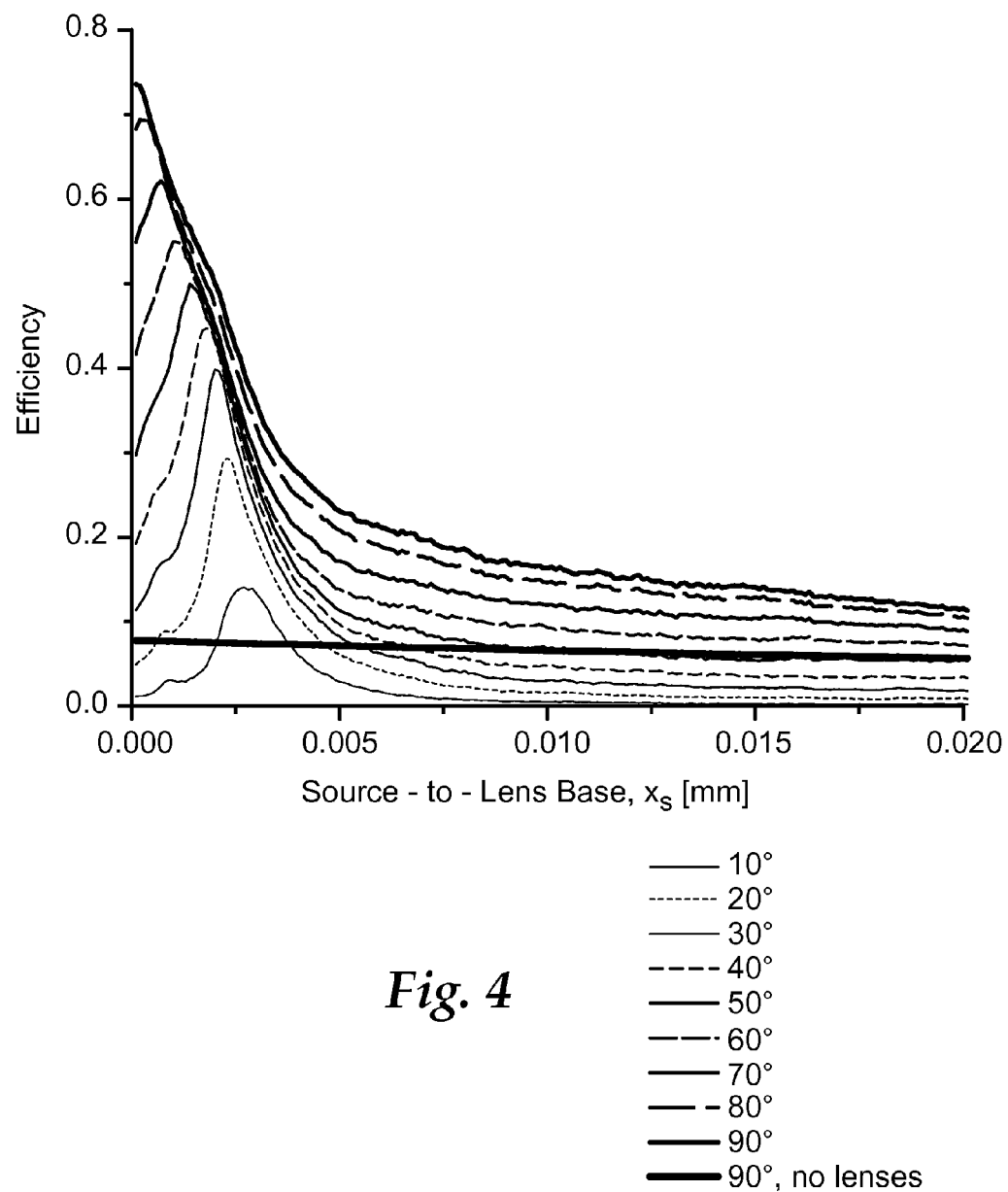
FIG. 4 is a graph of light output efficiency of a light source collected within various cone angles.

A model was constructed to simulate the significance of the collection cone angle on light output efficiency. The localized light emission region was fixed at 1×1 μm, while the cone angle and emission region-to-lenslet base thickness were varied. The refractive index of the lenslet was set equal to the refractive index of the emission region (n2=n3=2.39). FIG. 4 depicts a summary of curves of the light output efficiency collected within various cone angles.

For each cone angle, there was an emission region-to-lenslet base distance that provided a maximum in light output efficiency, the value of which depended on the cone angle. For narrower collection cone angles, the efficiency maximum was lower and located closer to the focal plane than for wider collection cone angles. The maximum efficiency was obtained when light was collected in a wider cone angle, such as that approaching a hemisphere, i.e. cone angle=90°. However, for light-directing applications, a collection cone angle around 30° is more practical.

For a given cone angle, the maximum light output efficiency was not achieved when the localized light emission region was at the focal point, but instead when the emission region-to-lenslet base distance was slightly smaller than the distance from the base of the lenslet to the focal point. The maximum light output efficiency for each cone angle approached the curve with a largest collection angle (90°) indicating that there was negligible high angle light output, i.e., less stray light.

The maximum light output collected within a hemisphere for an emitting material without lenslets was five times less than that with lenslets for a 30° collection cone angle. The addition of lenslets to the emitting surface provided a mechanism for light to exit the high index medium into a lower index material, thereby increasing the light output efficiency. For applications collecting light into a hemispherical cone angle, placing the light emitter directly at the base of the lenslet provided higher light output efficiency. However, for directed-light applications, such as a projection system, with light being collected within a narrow cone-angle (around 30°), it was seen that collimation was lost when the light emitter was close to the lenslet (0.5 to approximately 2 μm emission region-to-lenslet base distance), while the lenslet behaved as an extraction feature when the light emitter was farther from the focal point (over about 3 μm emission region-to-lenslet base distance). Not wishing to be bound by theory, the maximum light output efficiency may be understood as a combination of collimation and light extraction.

Influence of Light Emission Area and Lenslet Base Area

A localized light emission region coupled with a lenslet provided better light output efficiency than a continuous light emission region with or without a lenslet.

A model was created to show that as the emission region became smaller, the maximum light output efficiency was increased. The model used a collection cone angle of 30° to simulate the light being collected into a secondary optical system, such as in a light-directed application, or a projection system. A typical projection lens system used an f/# of 0.866 (a numerical aperture of 0.5), which is for a collection cone angle of 30°. Various light emitting areas were coupled with a fixed hemispherical lenslet with a height and radius of curvature of 5 μm. The refractive index of the lenslet was set equal to the refractive index of the emission region (n2=n3=2.39).

Figure 5:
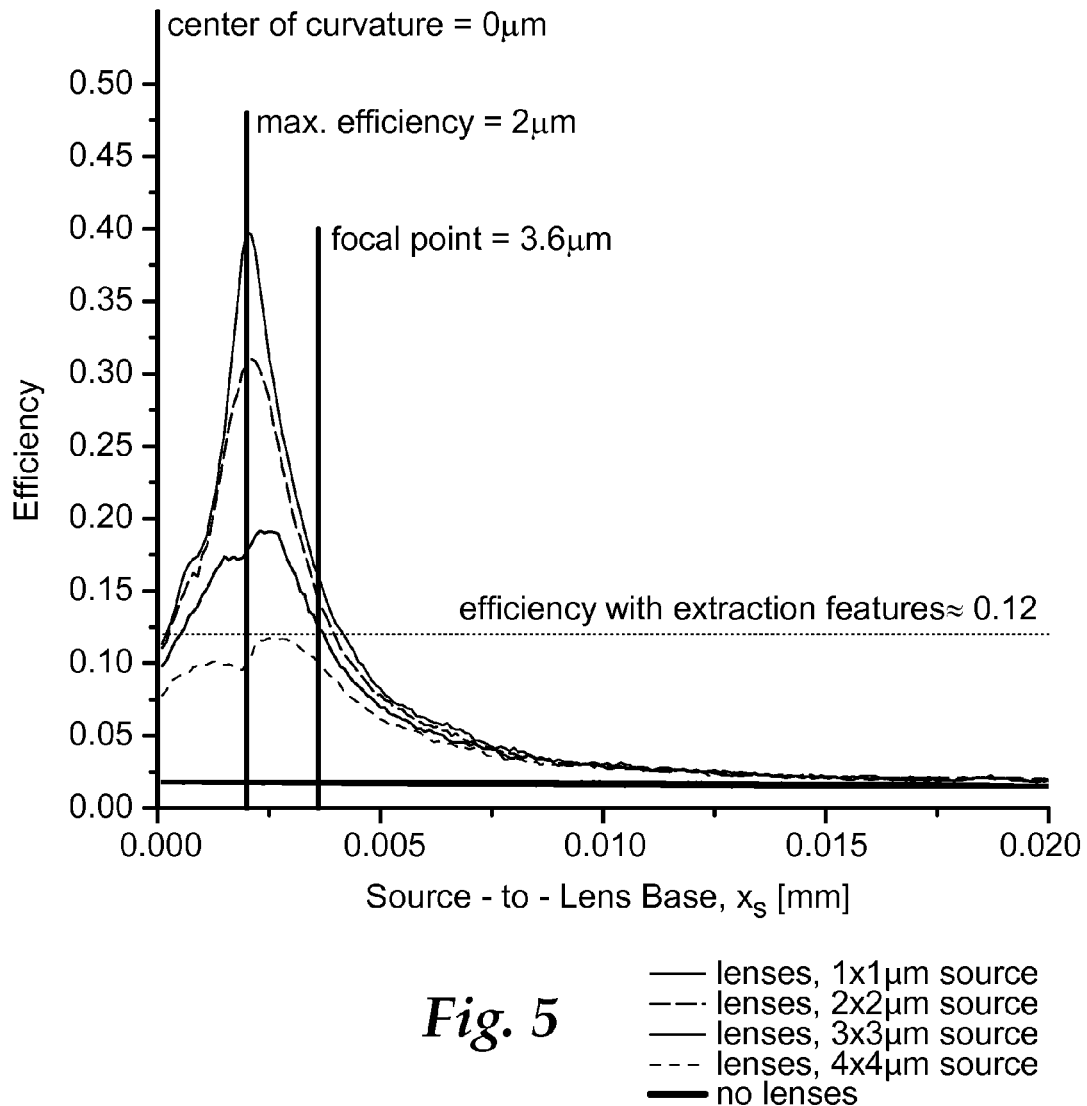
FIG. 5 is a graph of various areas of light emitting regions for a collection cone angle of 30°.

FIG. 5 shows the resulting curves for the various areas of localized light emission regions used in this model. For each area, the maximum light output efficiency occurred between the center of curvature and the focal point of the lenslet. The location of the maximum did not vary significantly with the emitting area. However, the light output efficiency did depend on the light emitting area, the highest peak in light output efficiency being for the smallest emission region. Therefore, the benefit of coupling a lenslet to a localized light emission region decreased with increased light emitting area.

Table 1 provides a summary of the maximum light output efficiency with varying ratios of light emitting area to lenslet base area. The enhancement in light output efficiency for each ratio compared to that of having no lenslets at the surface of the light emitting material is also given. For a ratio of 0.013, the light output efficiency at the focal point (located at 3.6 μm from the base of the lenslets) was 0.16, while the maximum light output efficiency (with the emission region located at 2.0 μm) was 0.40. Relative to the case with no lenslets (efficiency of 0.019), this provided an enhancement of 21 times the light output. As the ratio of light emitting area to lenslet base area increased beyond around 0.2, less impact on light output efficiency was observed in positioning the emission region at any location between the center of curvature and the focal point. Also, the addition of extraction features to a high refractive index light emitting surface has been shown to give light output efficiency of 0.12 into a collection cone angle of 30° (when modeling a similar light emitter with extraction features using Finite Difference Time Domain). Therefore, for ratios greater than approximately 0.1, little efficiency benefit was gained by using lenslets rather than extraction features.

TABLE 1

Summary of maximum light output efficiency with ratios of light emitting area to lenslet area

| | Light Emission Area/Lenslet Base Area | | | | |
|---|---|---|---|---|---|
| | 0.013 | 0.05 | 0.115 | 0.204 | No lenslets |
| Light Emission Region | 1 × 1 μm | 2 × 2 μm | 3 × 3 μm | 4 × 4 μm | 1 × 1 μm |
| Light Output Efficiency | 0.398 | 0.310 | 0.192 | 0.117 | 0.019 |
| Enhancement over No Lenslets | 21× | 16× | 10× | 6× | 1× |

Influence of Lenslet Refractive Index

Figure 6:
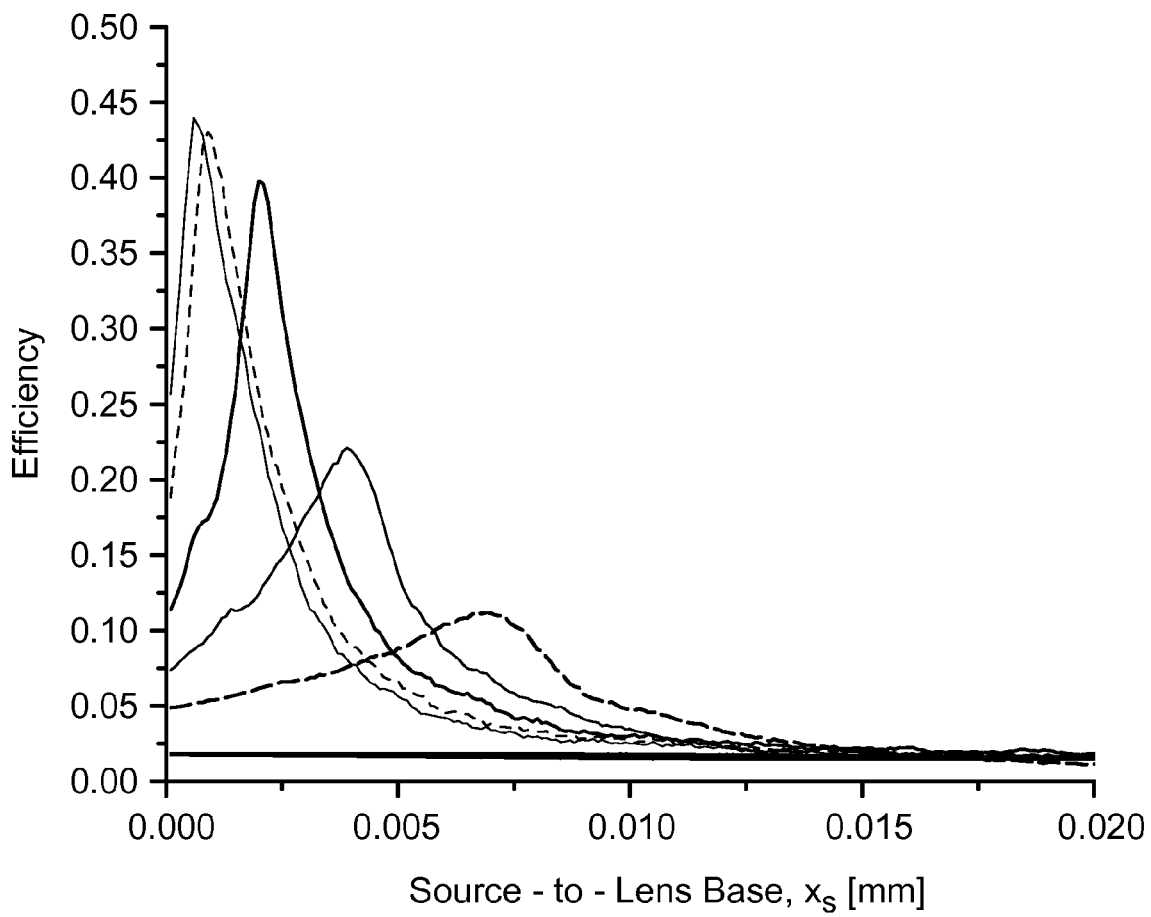
FIG. 6 is a graph displaying the effect of refractive index in a light source on light output efficiency.

A model was constructed to establish the influence of lenslet refractive index on light output efficiency. The lenslet height and radius of curvature were fixed at 5 μm. The localized light emission region was fixed at 1×1 μm. FIG. 6 displays the curves for lenslet refractive indices (n2) of 1.6, 2.0, 2.4, 2.8 and 3.0. Each case considered with a lenslet coupled to an emission region had significantly more light output efficiency than the case without lenslets, independent of lenslet refractive index. A shift in the maximum light output efficiency with refractive index was observed, with the highest efficiency obtained from the highest refractive index.

Calculations were made to further understand the position of the source for maximum light output efficiency. For a lenslet that has an arbitrary spherical cap:

$$H = R - \sqrt{R^2 - \left(\frac{D}{2}\right)^2}$$

where H was the height of the lenslet, R was the radius of curvature of the lenslet, and D was the diameter of the lenslet measured at the base. Better understanding of the variables used in the equations throughout this section may be understood by reference to FIG. 7.

Based on paraxial geometric optics, the image focal length, $f_i$, of the lenslet was:

$$f_i = \frac{n_2}{n_2 - n_1} R$$

The value of $f_i$ was the distance from the vertex of the lenslet, V, to the focal point of the lenslet along the optic axis.

In the models, the position of the localized light emission region or source (S) was varied to obtain the maximum light output efficiency, by adjusting the distance from the lenslet base to the emission region ($x_s$), measured along the optic axis.

To generalize this result, the emission region location, S, was expressed in terms of its relative position along the optic axis between two geometrical locations in the lenslet: (1) the center of curvature, C, and (2) $f_i$. If the lenslet base was selected as the origin for these calculations, then the values of $x_c$ and $x_f$ are:

$$x_c = R - H$$

$$x_f = f_i - H$$

Therefore, the scaled position of the emission region location relative to these principal points, σ, was:

$$\sigma = \frac{x_s - x_c}{x_f - x_c}$$

And, if $x_{s0}$ was the x-position of the source at the maximum light output efficiency, then the scaled position of the emission region location with maximum light output efficiency, $\sigma_0$, was:

$$\sigma_0 = \frac{x_{s0} - x_c}{x_f - x_c}$$

Figure 7:
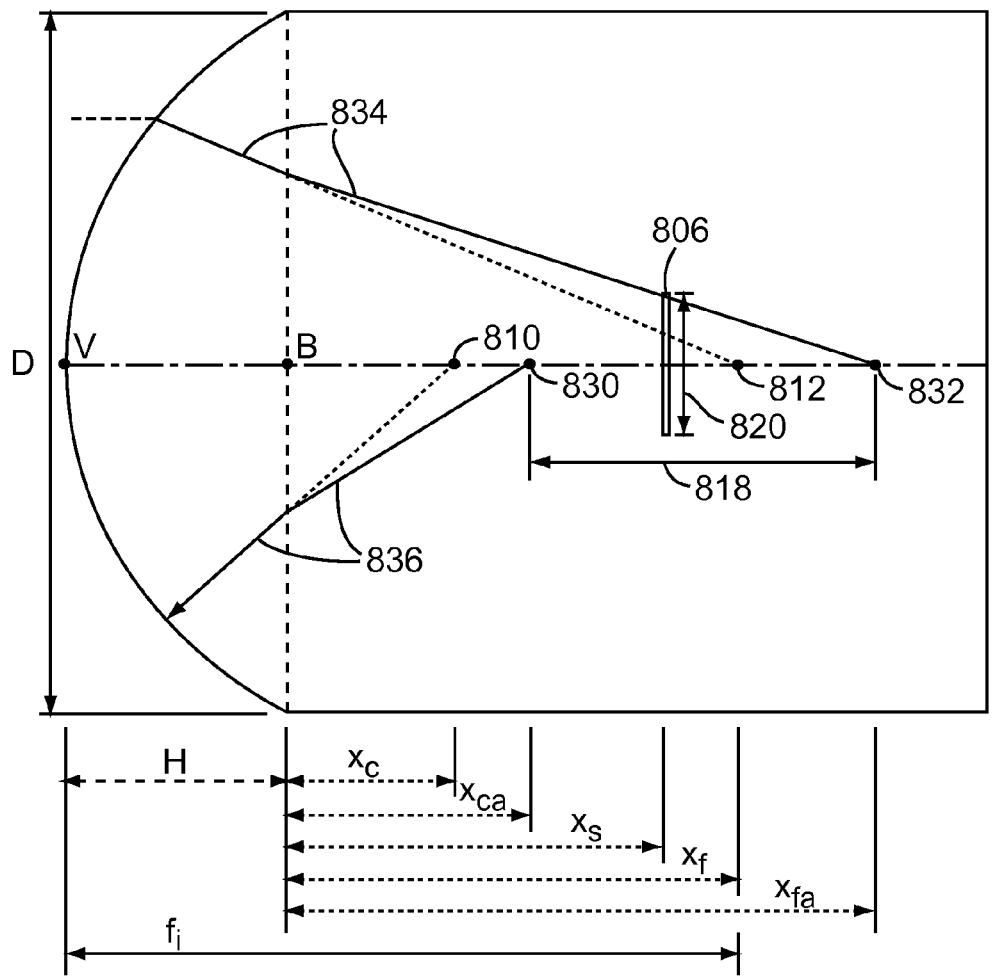
FIG. 7 is a cross-section view of a single lenslet portion of a light source with a lenslet array, as well as a corresponding single emission region of a light source with an array of localized emission regions.

FIG. 7 depicts a single lenslet structure for the case when the emission region was immersed in a material with an index n3 that was different from the refractive index of the lenslet portion (spherical cap). The region from V to B had an index of n2 while the portion to the right of B has an index n3. The focal length, t, of the lenslet was calculated from the equation above; however, when the rays cross the boundary at the base of the lenslet, they were bent by the change in refractive index. The bend in these rays was illustrated through elements 834 and 836 (FIG. 7). This bend caused the geometric points center of curvature 810 (C) and focal point 812 ($f_a$) to appear to be at different locations in the n3 medium (the locations of apparent center of curvature 830 ($C_a$) and apparent focal point 832 ($f_a$)). Again using paraxial approximation, the distances from the base of the lenslet B to the apparent center of curvature and the apparent focal point were:

$$x_{ca} = \frac{n_3}{n_2} x_c = \frac{n_3}{n_2}(R - H)$$

$$x_{fa} = \frac{n_3}{n_2} x_f = \frac{n_3}{n_2}(f_i - H)$$

provided that R>H and $f_i$>H.

These equations were used to calculate the scaled position of the optimum emission region location $\sigma_0$ for the case of a lenslet having a different index of refraction than the emission region medium.

$$\sigma_{0a} = \frac{x_{s0} - x_{ca}}{x_{fa} - x_{ca}}$$

Figure 8:
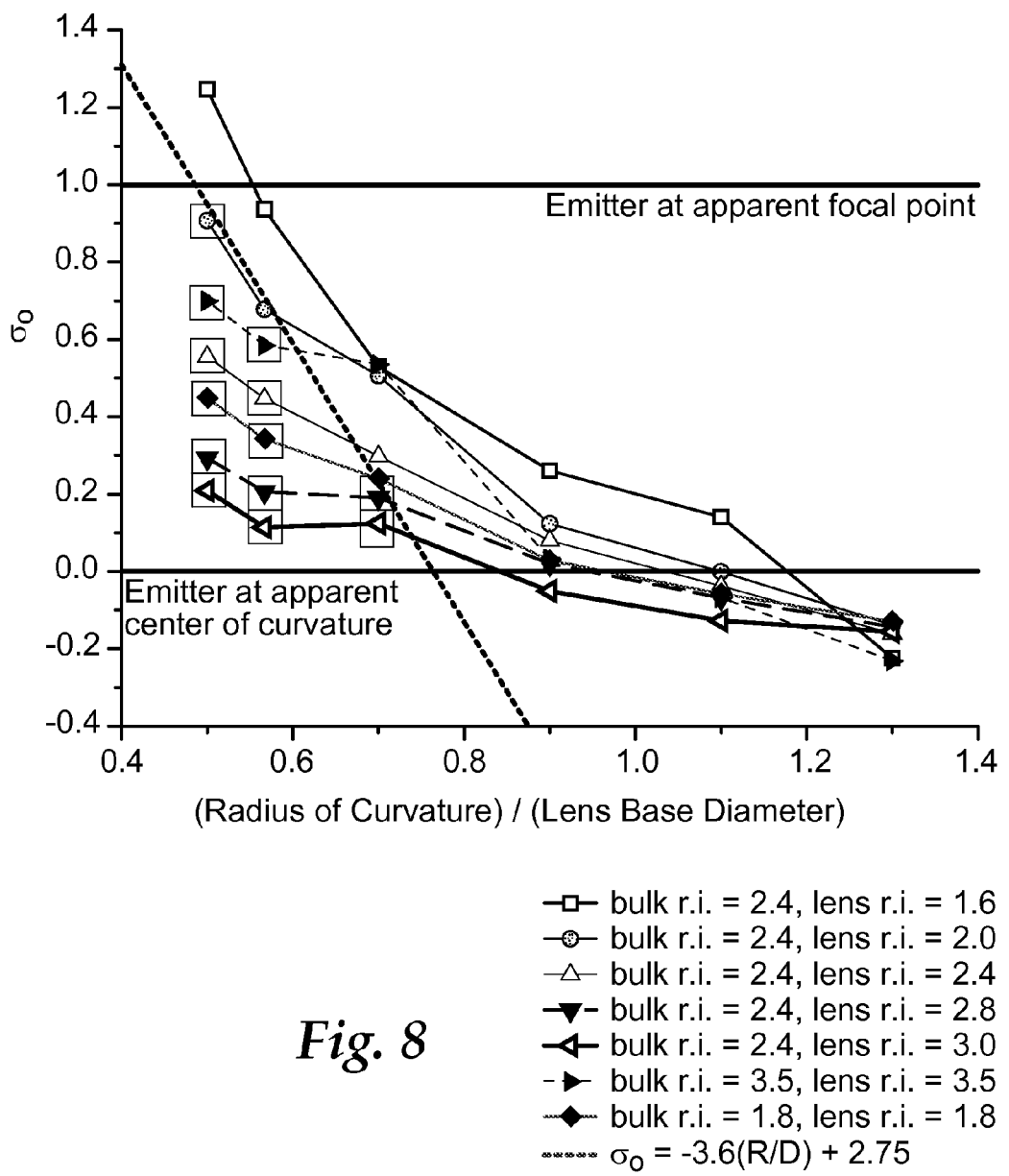
FIG. 8 is a plot of the relative position of emission regions between the apparent focal point and the apparent center of curvature, vs. the value of (radius of curvature of lenslet/lenslet base diameter).

FIG. 8 was constructed with the localized light emission region fixed at 1×1 μm. The lenslet height and radius of curvature were varied to obtain a range of ratios of radius of curvature to lenslet base diameter. The curves in FIG. 8 include variations of lenslet refractive index of 1.6, 2.0, 2.4, 2.8, and 3.0, with the light emitting material refractive index fixed at 2.39, as well as variations where both the lenslet and light emitting material were index matched at indices of refraction of 1.8 and 3.5. To compare the different cases of refractive index and radius of curvature, the absolute position of the maximum light output efficiency was scaled to its relative position between the apparent focal point and the apparent center of curvature; the value is referred to as $\sigma_0$. FIG. 8 shows how $\sigma_0$ varied as a function of the ratio of lenslet radius of curvature to lenslet base diameter. Each point on the curve therefore represented the maximum light output efficiency for a given combination of lenslet refractive index and ratio of radius of curvature-to-lenslet base diameter. Since the lenslet base diameter was fixed at 10 μm, a large radius of curvature produced the optimal light output efficiency solution when the emission region is close to the optical center of curvature. Likewise, for a small radius of curvature, the maximum light output efficiency solution was close to the optical focal point.

A similar procedure can be used for other optical elements to locate the light emitting position for maximum light output efficiency. The points in FIG. 8 including a square outline indicate the conditions that provide the largest benefit in light output efficiency from the system described herein. These points are well above the efficiency obtained for the case with extraction features alone. The points that follow the dotted line in FIG. 8 provide values in efficiency that are not much higher than from extraction features. The points above and to the right of the dotted line provide similar light output efficiency as obtained from extraction features. The dotted line is defined by the function:

$$\sigma_0 = -3.6 \cdot \left(\frac{R}{D}\right) + 2.75$$

In some embodiments, the present application provides devices that use lenses to provide a larger gain in efficiency than extraction features can provide. However, in applications that require collimation with light output efficiency similar to extraction features, lenses with parameters above or to the right of the dotted line can be used.

From the examples above, it was possible to determine a relationship of the position of emission region 806 (with region diameter 820) between the apparent center of curvature 830 and apparent focal point 832, at a point where performance is optimized (with regard to optical cross talk, efficiency and light collimation).

The relationship is shown by the line function drawn through FIG. 8. Points to the left of and below the line are in the optimized range of $\sigma_0$ distances (between 0 and 1). It should be recalled that $\sigma_0$ serves as a normalized distance. In this case, the $\sigma_0$ value of 0 is equivalent to the apparent center of curvature position, and $\sigma_0$ value of 1 is equivalent to the apparent focal point. In other words, the $\sigma_0$ value is equal to the fractional distance traveled from the apparent center of curvature to the apparent focal point (along the optic axis). With reference to FIG. 7, $\sigma_0$ is the distance positioned from the apparent center of curvature 830 and apparent focal point 832, where the total distance 818 is equal to 1.

With the optimized line then, it is possible to define the appropriate position of the emission region in relation to the (radius of curvature/the lenslet base diameter). The appropriate $\sigma_0$ position (greater than 0) is:

$$\sigma_0 < -3.6 \cdot \left(\frac{R}{D}\right) + 2.75$$

Or, equivalently:

$$\frac{R}{D} < -\frac{1}{3.6}(\sigma_0) + 0.7639$$

Allowing a little more room for error, however, and in the desire for more round numbers, it can be stated that:

$$\frac{R}{D} < -\frac{1}{4}(\sigma_0) + 0.8$$

It may also be possible to define the acceptable parameters for placement of the emission regions with respect to the lenslet in a more generalized way. For example, where the lenslet has an index of refraction of between 1.8 and 3.5, and where the radius of curvature of the lenslet divided by the lenslet base diameter is greater than 0.5 and less than 0.75, the emission regions are positioned between the apparent center of curvature and apparent focal point.

The equations above may also be seen as a method for determining placement of a localized light emission region from an optically coupled lenslet in order to optimize collimation and efficiency. The method involves positioning the elements at a distance according to the equations above. Alternatively, the placement may be determined by the refractive index differential between the localized light emission region and the lenslet material (n3 and n2).

Another appropriate method would fall into the more generalized method for determining the spatial placement of the emission region. Therefore, rather than follow the line function of FIG. 8, one can determine placement such that where the radius of curvature divided by the lenslet base diameter is less than 0.75, the pixelated imagers are to be positioned between the apparent center of curvature and the apparent focal point.

Crosstalk Minimization

To obtain high image quality in applications including emissive imaging devices, it was extremely important to direct the light being generated by each pixel to be emitted directly above that pixel. A model was created to simulate the minimization of crosstalk using the conditions of the devices described herein. The model included a single localized light emission region coupled to a single hemispherical lenslet. Sidewalls were selected as either 0 or 100% reflective. The 0% reflective sidewalls allowed simulation of the fraction of the light that exited a pixel without traveling into an adjacent pixel (i.e., absorbing light that hit the sidewall was the same as absorbing any light that propagated into an adjacent pixel). The 100% reflective sidewalls allowed simulation of the total amount of light that exited the pixel array independent of which pixel it exited from.

Crosstalk levels may be represented by pixel fidelity, $\Phi$, which is the ratio of the efficiency with 0% reflecting side walls to the efficiency with 100% reflecting sidewalls, or the inverse of crosstalk (defined as the amount of light exiting all pixels divided by the amount of light exiting the desired pixel):

$$\Phi = \frac{\text{Efficiency}(0\% \text{ reflective})}{\text{Efficiency}(100\% \text{ reflective})} = \frac{1}{\text{crosstalk}}$$

Figure 9:
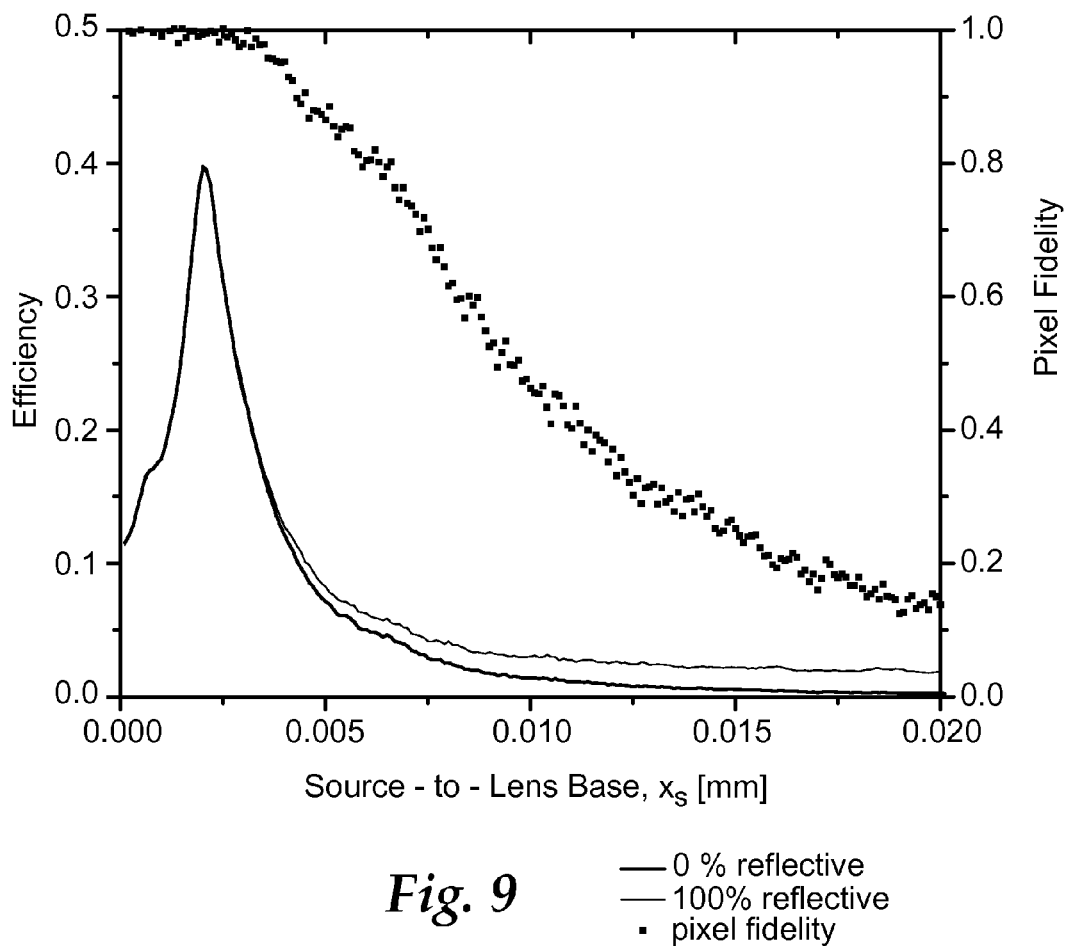
FIG. 9 is a graph of light output efficiency of light sources as related to pixel fidelity.

FIG. 9 shows the curves for light output efficiency of the two reflective conditions.

Very little variation in peak light output efficiency was seen between the two curves. The pixel fidelity was included on the secondary y-axis of FIG. 9. A high pixel fidelity metric near 1.0 was desirable because this indicated that most of the collected light from an emission region exited through its associated lenslet. Most preferably the metric will be between 0.8 and 1.0. As the distance between the light emission region and the lenslet base increased, the pixel fidelity metric, $\Phi$, declined, and therefore, the crosstalk increased. There was a correlation between high fidelity and high light output efficiency, suggesting that light was not being extracted randomly, but light was being emitted directly above its corresponding localized light emission region; both benefits of optimized light output efficiency and minimized crosstalk can be obtained.

We claim:

1. A light source comprising:
   a monolithic emissive semiconductor device; and
   an array of lenslets, the lenslets being optically and mechanically coupled to the monolithic emissive semiconductor device;
   wherein the monolithic emissive semiconductor device comprises an array of localized light emission regions, each region corresponding to a given lenslet;
   wherein the lenslets have an apparent center of curvature ($C_a$), an apparent focal point ($f_a$), a radius of curvature (R) and a lenslet base diameter (D), the base diameter being the width of the lenslet at the intersection with the monolithic emissive semiconductor device;
   wherein the distance along the lenslet optic axis between the $C_a$ and the $f_a$ are normalized, such that $C_a$ is located at distance 0 and $f_a$ is located at point 1;
   wherein each localized light emission region is located at a point that is greater than 0, and less than $$\left(-3.6 \cdot \left(\frac{R}{D}\right) + 2.75\right);$$

and
   wherein each light emission region has a diameter, the emission region diameter measuring one-third or less of a corresponding lenslet base diameter.

2. The light source of claim 1, wherein 60% of light emitted from the monolithic emissive semiconductor device exits the lenslet array within a cone of 30 degrees half-angle.

3. The light source of claim 1, wherein each lenslet corresponds to a pixel, and the light source has a pixel fidelity metric between 0.8 to 1.0.

4. The light source of claim 1, wherein the monolithic emissive semiconductor device comprises an LED, a superluminescent diode, or a photoluminescent quantum well material array.

5. The light source of claim 1, wherein the lenslets and emission regions each have an index of refraction, the index of refraction of the lenslet being equal to or greater than the index of refraction of the emission region.

6. The light source of claim 1, wherein the lenslets and emission regions each have an index of refraction, the index of refraction of the lenslet being equal to or less than the index of refraction of the emission region.

7. The light source of any of claims 1, wherein the monolithic emissive semiconductor device comprises a semiconductor material, and wherein the lenslets are formed into the semiconductor material.

8. The light source of any of claims 1, wherein the lenslets are formed into a secondary material that is coupled to a semiconductor material.

9. The light source of claim 8, wherein the lenslets are molded, and are subsequently bonded to the monolithic emissive semiconductor device through adhesive or wafer-bonding technique.

10. The light source of claim 1, wherein the emission regions are individually addressable.

11. The light source of claim 1, wherein the emission regions are located within an electroluminescent material or a photoluminescent material.

12. The light source of claim 1, further comprising a reflective back plane, located on an opposite surface of the monolithic emissive semiconductor device from the lenslet array.

13. The light source of claim 1 wherein at least one the lenslets in the array of lenslets is shaped as a spherical lenslet, a cylindrical lenslet, or an aspheric lenslet.

14. A semiconductor light source, comprising:
    a monolithic array of localized light emission regions; and
    an array of lenslets, each lenslet corresponding in a one-to-one relationship to a localized light emission region and being optically coupled to the element to receive light from it;
    wherein each lenslet has a radius of curvature (R), a lenslet base diameter (D), an apparent focal point ($f_a$) and an apparent center of curvature ($C_a$),
    wherein $$\frac{R}{D} < -\frac{1}{4}(\sigma_0) + 0.8,$$

where $\sigma_o$ is the negative normalized distance between $C_a$ and $f_a$;
    and further wherein each emission region has a diameter, the emission region diameter being one-third or less than the lenslet base diameter of the lenslet to which it is optically coupled.

15. A light source comprising:
    a monolithic emissive semiconductor device; and
    an array of lenslets, the lenslets being optically and mechanically coupled to the monolithic emissive semiconductor device, and the lenslets having an index of refraction of between 1.8 and 3.5;
    wherein the monolithic emissive semiconductor device comprises an array of localized light emission regions, each region corresponding to a given lenslet;
    wherein the lenslets have an apparent center of curvature ($C_a$), an apparent focal point ($f_a$), a radius of curvature (R) and a base diameter (D), D being the width of the lenslet at an interface with the monolithic emissive semiconductor device;
    wherein $$0.75 > \frac{R}{D} > 0.5;$$

wherein each emission region is positioned between $C_a$ and $f_a$ of its corresponding lenslet; and wherein each emission region has a diameter, the emission region diameter being one-third or less than its corresponding lenslet's base diameter.

16. A method for creating a light source comprising: providing a monolithic emissive semiconductor device with an array of pixelated light emission regions; and forming an array of lenslets onto the light output surface of the monolithic device, with each lenslet corresponding to a light emission region, the lenslets formed such that a radius of curvature of the lenslet divided by a lenslet base diameter is less than 0.75 and such that a apparent focal length of the lenslet and an apparent center of curvature of the lenslet surround the pixelated light emission regions, where the pixelated light emission regions are positioned between the apparent center of curvature to the apparent focal point, and wherein each light emission region has a diameter that measures one-third or less than a corresponding lenslet base diameter.

17. The method of claim 16, wherein the light output surface of the monolithic device comprises a material different from the material forming the emission regions, the light output surface being bonded to the emission regions.

18. The method of claim 17, wherein the light output surface is bonded to the emission regions before the lenslets are formed onto it.

19. The method of claim 17, wherein the light output surface is bonded to the emission regions after the lenslets are formed onto it.

20. The method of claim 16, wherein the light output surface and emission regions are comprised of the same materials.

21. The method of claim 20, further comprising etching the output surface material into lenslet shapes.

22. The method of any of claims 16, wherein the array of lenslets are formed by a first step of photoresist reflow, grayscale lithography, nano-imprint lithography, inkjet printing of a resist, or interference lithography, followed by a second step of etching.

23. The method of any of claims 16, wherein the pixelated light emission regions are formed by localized current injection by electrode design, or by spatially selective ion implantation.

* * * * *

UNITED STATES PATENT AND TRADEMARK OFFICE
CERTIFICATE OF CORRECTION

PATENT NO. : 8,657,475 B2  
APPLICATION NO. : 13/499884  
DATED : February 25, 2014  
INVENTOR(S) : Nicole J. Wagner et al.

Page 1 of 1

It is certified that error appears in the above-identified patent and that said Letters Patent is hereby corrected as shown below:

In the Specification:

Column 14
Line 37, Delete "t," and insert -- $f_i$, --, therefor.

In the Claims:

Column 18
Line 3, In Claim 7, delete "any of claims 1" and insert -- claim 1 --, therefor.
Line 7, In Claim 8, delete "any of claims 1" and insert -- claim 1 --, therefor.

Column 20
Line 13, In Claim 22, delete "any of claims 16" and insert -- claim 16 --, therefor.
Line 18, In Claim 23, delete "any of claims 16" and insert -- claim 16 --, therefor.

Signed and Sealed this
Eighth Day of July, 2014

Michelle K. Lee
*Deputy Director of the United States Patent and Trademark Office*